(12) United States Patent
Ozawa et al.

(10) Patent No.: US 10,439,126 B2
(45) Date of Patent: Oct. 8, 2019

(54) PIEZOELECTRIC ACTUATOR

(71) Applicant: TDK CORPORATION, Tokyo (JP)

(72) Inventors: Satoshi Ozawa, Tokyo (JP); Koji Taniwaki, Tokyo (JP); Toshiki Maruyama, Tokyo (JP); Akihiro Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 484 days.

(21) Appl. No.: 15/417,713

(22) Filed: Jan. 27, 2017

(65) Prior Publication Data
US 2017/0222119 A1    Aug. 3, 2017

(30) Foreign Application Priority Data

Jan. 29, 2016 (JP) ................. 2016-016209

(51) Int. Cl.
H01L 41/083 (2006.01)
H01L 41/09 (2006.01)
H01L 41/047 (2006.01)
H01L 41/053 (2006.01)
H02N 2/04 (2006.01)

(52) U.S. Cl.
CPC ........ H01L 41/0472 (2013.01); H01L 41/083 (2013.01); H02N 2/04 (2013.01)

(58) Field of Classification Search
CPC ...... H01L 41/0472; H01L 41/083; H02N 2/04
USPC ................................. 310/328, 366
See application file for complete search history.

(56) References Cited

U.S. PATENT DOCUMENTS

| 5,912,527 A * | 6/1999 | Karrai ............... H02N 2/025 310/328 |
| D814,427 S * | 4/2018 | Ozawa .................. D13/173 |
| 2004/0113525 A1* | 6/2004 | Hardy ................ F02M 47/027 310/328 |
| 2006/0132001 A1* | 6/2006 | Sugg .............. H01L 41/0533 310/366 |
| 2007/0228884 A1* | 10/2007 | Manabe ............ G02B 7/102 310/328 |

(Continued)

FOREIGN PATENT DOCUMENTS

| JP | 2587406 | * 10/1998 | .......... H01L 41/083 |
| JP | 2002-153461 A | 5/2002 | |

(Continued)

Primary Examiner — Thomas M Dougherty
(74) Attorney, Agent, or Firm — Oliff PLC

(57) ABSTRACT

A piezoelectric actuator includes a piezoelectric element, a connection member of a shaft or weight connected to an element end surface of the piezoelectric element, the other one of the shaft and weight connected to a first end surface constituting an end surface opposing to the element end surface of the piezoelectric element, a wiring portion, and a resin portion. The piezoelectric element forms external electrodes on surfaces thereof, alternately laminates internal electrode layers with piezoelectric layers therebetween, and provides part of the external electrodes on the element end surface. The wiring portion has conductive portions corresponding to the external electrodes. The resin portion fixes the piezoelectric element, the connection member, and the wiring portion so that the element end surface opposes to the connection member with the wiring portion therebetween and that the conductive portions are electrically connected to the external electrodes.

12 Claims, 10 Drawing Sheets

(56) References Cited

U.S. PATENT DOCUMENTS

| | | | | |
|---|---|---|---|---|
| 2011/0215674 A1* | 9/2011 | Rinner | ................... | H01L 41/29 |
| | | | | 310/318 |
| 2012/0267987 A1* | 10/2012 | Yuasa | ................. | H01L 41/0472 |
| | | | | 310/366 |
| 2014/0167568 A1* | 6/2014 | Ozawa | ............... | H01L 41/0475 |
| | | | | 310/364 |
| 2015/0133950 A1* | 5/2015 | Shelton | ............. | A61B 17/2202 |
| | | | | 606/128 |
| 2015/0243876 A1* | 8/2015 | Ozawa | ............... | H01L 41/0533 |
| | | | | 310/323.12 |
| 2015/0243877 A1* | 8/2015 | Ozawa | ............... | H01L 41/0533 |
| | | | | 310/323.12 |
| 2017/0139171 A1 | 5/2017 | Ozawa et al. | | |
| 2017/0190227 A1 | 7/2017 | Genmei | | |

FOREIGN PATENT DOCUMENTS

| | | | |
|---|---|---|---|
| JP | 2008-199773 | A | 8/2008 |
| JP | 2014-060214 | A | 4/2014 |
| JP | 2015-057838 | A | 3/2015 |
| WO | 2014/097862 | A1 | 6/2014 |
| WO | 2016-002262 | A1 | 1/2016 |

* cited by examiner

PIEZOELECTRIC ACTUATOR

BACKGROUND OF THE INVENTION

1. Field of the Invention

The present invention relates to a piezoelectric actuator that drives an object member.

2. Description of the Related Art

A piezoelectric actuator is an actuator that utilizes piezoelectric effect and inverse piezoelectric effect and utilizes characteristics of a piezoelectric element that mutually converts mechanical displacement and electrical displacement, and is used in various fields as linear actuator or so that provides an object with linear displacement.

Mechanical displacement obtained from the piezoelectric actuator is comparatively fine, and thus the actuator is favorably used for the purpose that requires precise and correct control as for a lens driving of a camera, for example. Electricity is supplied to a piezoelectric element assembled in such a piezoelectric actuator via a wiring portion fixed to external electrodes formed on side surfaces of the piezoelectric element (see Patent Document 1).

Patent Document 1: JP 2008-199773 A

SUMMARY OF THE INVENTION

However, the piezoelectric actuators have been miniaturized in accordance with miniaturization in recent years of camera modules, lens modules, and the like, and thus a conventional actuator that fixes a wire to a side surface (surface along a lamination direction) of the piezoelectric element has a problem that displacement of the piezoelectric element is affected by influence of a fixing portion that fixes the wire. That is, side surfaces of the piezoelectric element are where a large displacement occurs, and the following problems thus arise: displacement of the piezoelectric element is prevented if the fixing portion is arranged on the side surfaces; and a displacement direction of the piezoelectric element may be inclined due to a fine positional displacement of the fixing portion when the fixing portions are fixed to both surfaces of the piezoelectric element.

As one solution to such problems, it is conceivable that the wiring portion is fixed to an area of the side surface of the piezoelectric element where no internal electrode layers are formed, for example. To carry out this embodiment, however, the area where no internal electrode layers are formed needs to be large, and it is thus hard to sufficiently meet demand in miniaturization.

The present invention has been achieved in view of such circumstances. It is an object of the invention to provide a piezoelectric actuator that is small yet has fixing structure of the wiring portion hard to disturb a displacement of the piezoelectric element.

To achieve the object, a piezoelectric actuator according to the present invention includes:

a piezoelectric element forming a pair of external electrodes on surfaces of the piezoelectric element; alternately laminating internal electrode layers electrically connected to the external electrodes with piezoelectric layers therebetween; and providing part of the external electrodes on an element end surface constituting part of the surfaces and an end surface in a lamination direction of the piezoelectric element, a connection member consisting of one of a shaft and a weight connected to a side of the element end surface of the piezoelectric element, the other one of the shaft and the weight connected to a side of a first end surface constituting an end surface opposing to the element end surface of the piezoelectric element, a wiring portion having a pair of conductive portions corresponding to the pair of the external electrodes, and a resin portion fixing the piezoelectric element, the connection member, and the wiring portion so that the element end surface opposes to the connection member with the wiring portion therebetween and that the conductive portions are electrically connected to the external electrodes.

In the piezoelectric actuator according to the present invention, part of the external electrodes is formed on the element end surface, and the conductive portions of the wiring portion are electrically connected to the element end surface. Thus, a fixed portion of the piezoelectric actuator according to the present invention is hard to disturb a displacement of the element compared with prior arts where fixing structure of a wiring portion is provided on a side surface of a piezoelectric element. In addition, the element end surface opposes to the connection portion consisting of one of the shaft and the weight with the wiring portion therebetween, and the wiring portion fixed to the piezoelectric element and the connection member are overlapped on the side of the element end surface of the piezoelectric element. Thus, the piezoelectric actuator according to the present invention is easy to be manufactured compared with conventional piezoelectric actuators where one of wiring portions is fixed to a side surface and the other wiring portion is fixed to an end surface. Incidentally, a member to be connected to the side of the element end surface may be the shaft for driving or the weight as an inertial body, but the other one that is not connected to the side of the element end surface is connected to the side of the first end surface that is an end surface opposing to the element end surface of the piezoelectric element.

For example, the external electrodes on the element end surface may be formed along a pair of opposing sides of the element end surface, and one of the external electrodes on the element end surface may extend from one of a pair of opposing sides of the element end surface to the other side of the pair of the opposing sides, and the other external electrode on the element end surface may extend from the other side of the pair of the opposing sides to the one side of the pair of the opposing sides.

Such external electrodes can be favorably connected from the side surfaces to the end surface while mutual insulation of a pair of the external electrodes is maintained.

For example, the wiring portion may be a flexible printed circuit board having a coating portion with insulation configured to coat the pair of the conductive portions, and a through section where the resin portion passes through between the pair of the conductive portions in the lamination direction may be formed in the coating portion.

Forming the through section passed by resin can enhance a bonding force between the element end surface and the connection member by the resin, and can enhance insulation characteristics between a pair of the conductive portions.

For example, the wiring portion may be a flexible printed circuit board having a coating portion with insulation configured to coat the pair of the conductive portions, and an entire surface of the element end surface may oppose to the wiring portion.

The entire surface of the element end surface opposes to the wiring portion, which can enhance a bonding force between the element end surface and the wiring portion.

For example, the wiring portion may be a flexible printed circuit board having a coating portion with insulation configured to coat the pair of the conductive portions, and a length of the wiring portion in a width direction vertical to the lamination direction and to an extending direction of the conductive portions may be shorter than a length of the element end surface in the width direction.

Having a length in the width direction of the wiring portion that is shorter than that of the element end surface makes it easy to allow the resin portion to go around outside the wiring portion and to connect the element end surface and the connection member. Thus, such a piezoelectric actuator can improve a fixing reliability due to the resin portion.

DESCRIPTION OF THE PREFERRED EMBODIMENTS

Hereinafter, embodiments of the present invention will be described based on the figures.

First Embodiment

Figure 1:
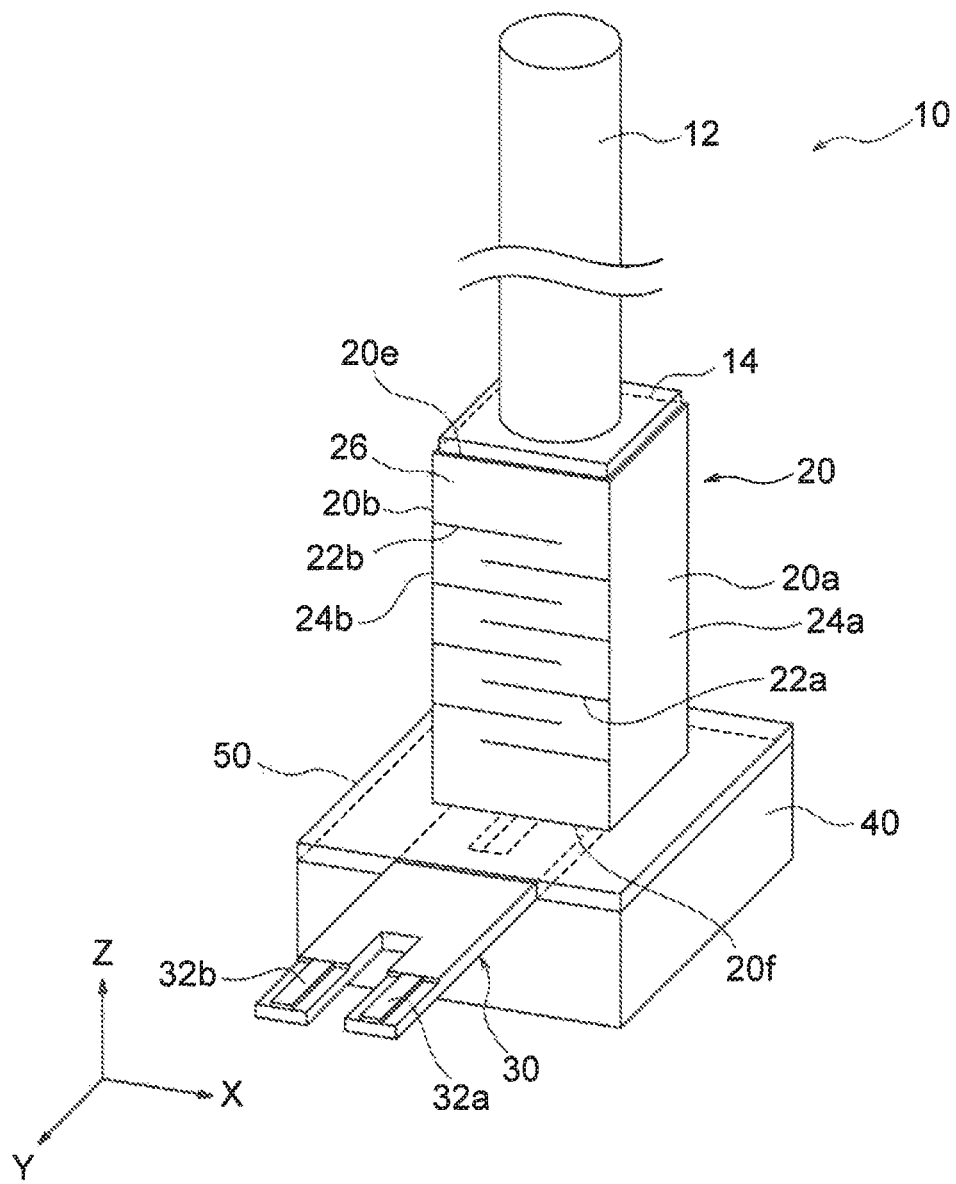
FIG. 1 is a conceptual view showing a piezoelectric actuator according to First Embodiment of the present invention.

FIG. 1 is a conceptual figure showing a piezoelectric actuator 10 according to First Embodiment of the present invention. The piezoelectric actuator 10 has a piezoelectric element 20, a shaft 12, a connection portion 14, a wiring portion 30, a weight 40, and a resin portion 50.

The piezoelectric element 20 has an approximately rectangular outer shape. A pair of external electrodes of a first external electrode 24a and a second external electrode 24b is formed on the surfaces of the piezoelectric element 20. In the piezoelectric element 20, internal electrode layers 22a connected to the first external electrode 24a and internal electrode layers 22b connected to the second external electrode 24b are alternately laminated with piezoelectric layers 26 therebetween.

The surfaces of the piezoelectric element 20 include four side surfaces extending along a lamination direction (Z-axis direction) and two end surfaces in the lamination direction (end surfaces extend in a vertical direction to the lamination direction). In the description of the piezoelectric actuator 10, the Z-axis direction is the lamination direction, the Y-axis direction is a vertical direction to the Z-axis direction and is an extending direction of first and second conductive portions 32a and 32b mentioned below, and the X-axis direction is a perpendicular direction to the Z-axis direction and the Y-axis direction.

Figure 2A:
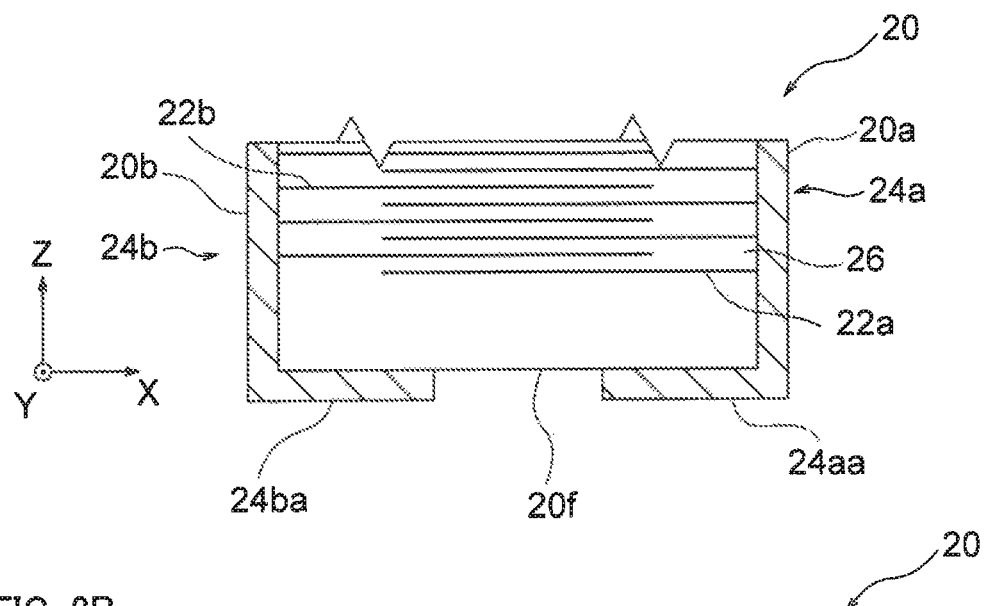
FIG. 2A is a partial cross sectional view of a piezoelectric element of the piezoelectric actuator of FIG. 1

The first external electrode 24a is formed on a first side surface 20a extending along the lamination direction (Z-axis direction). The second external electrode 24b is formed on a second side surface 20b opposing to the first side surface 20a. As shown in FIG. 2A, which is a cross sectional view of the piezoelectric element 20, the first external electrode 24a extends from the first side surface 20 to a second end surface 20f, and a first external electrode end surface portion 24aa is part of the first external electrode 24a and is provided on the second end surface 20f as an element end surface that is part of the surfaces of the piezoelectric element 20 and is an end surface in the lamination direction. The second external electrode 24b extends from the second side surface 20b to the second end surface 20f, and a second external electrode end surface portion 24ba is part of the second external electrode 24b and is provided on the second end surface 20f similarly to the first external electrode end surface portion 24aa.

Figure 2B:
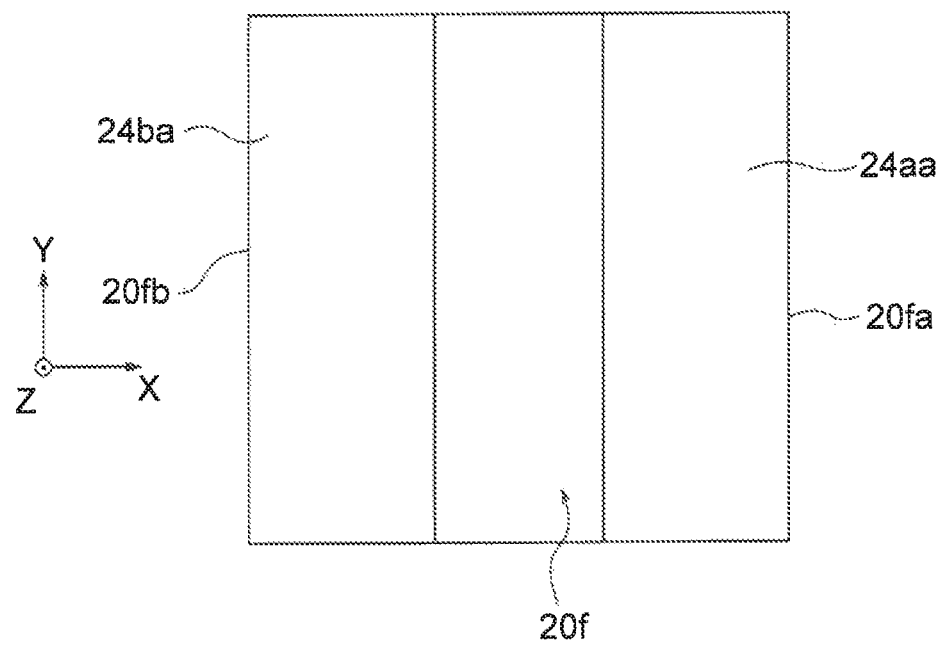
FIG. 2B is a figure showing an element end surface of the piezoelectric element.

As shown in FIG. 2A and FIG. 2B, the first external electrode end surface portion 24aa and the second external electrode end surface portion 24ba are formed with a predetermined space on the second end surface 20f of the piezoelectric element 20. The first external electrode 24a including the first external electrode end surface portion 24aa and the second external electrode 24b including the second external electrode end surface portion 24ba are insulated from each other. The external electrode end surface portions 24aa and 24ba on the second end surface 20f are formed along a pair of opposite sides 20fa and 20fb of the second end surface 20f.

That is, the first external electrode end surface portion 24aa is formed along one opposite side 20fa of a pair of the opposite sides 20fa and 20fb present between the second end surface 20f and the first side surface 20a. The second external electrode end surface portion 24ba is formed along the other opposite side 20fb of a pair of the opposite sides 20fa and 20fb present between the second end surface 20f and the second side surface 20b.

A thickness of the piezoelectric layer 26 of the piezoelectric element 20 is not limited, but is preferably about 5 to 50 μm. The piezoelectric layer 26 is made of any material showing piezoelectric effect or inverse piezoelectric effect, and is made of, for example, $PhZr_xTi_{1-x}O_3$, $BaTiO_3$, or the like, A component for improvement in characteristics or so may be contained, and an amount thereof is appropriately determined based on desired characteristics.

A conductive material constituting the internal electrodes 22a and 22b is not limited. As this conductive material, a noble metal of Ag, Pd, Au, Pt etc., an alloy of these (Ag—Pd etc.), a base metal of Cu, Ni etc., an alloy of these, or the like is used, for example. A conductive material constituting the first external electrode 24a and the second external electrode 24b is not limited either, and a similar material to the conductive material constituting the internal electrodes can be used. Incidentally, a plating layer or a sputtered layer of the above various metals may be formed outside the first external electrode 24a and the second external electrode 24b.

As shown in FIG. 1, the shaft 12 is coupled with the side of a first end surface 20e of the piezoelectric element 20 via the connection portion 14. For example, when the piezoelectric actuator 10 is used as a lens drive module, a movable member not shown is freely engaged with the shaft 12. The movable member retains an optical system or so, and the movable member and the optical system retained thereby can be displaced in the Z-axis direction along the shaft 12 due to a driving force of the piezoelectric actuator 10.

The shaft 12 is made of any material, such as metal, carbon, and resin. The connection portion 14 is also made of any material that couples the shaft 12 and the piezoelectric element 20, such as adhesive cured layer where adhesive is cured.

As shown in FIG. 1, the weight 40 as the connection member is connected to the side of the second end surface 20f of the piezoelectric element 20. The weight 40 functions as an inertial body for providing displacement with the shaft 12 coupled with the side of the first end surface 20e. The weight 40 is made of any material, such as metal material like tungsten whose specific weight is comparatively large and alloy containing this kind of metal.

As shown in FIG. 1, the wiring portion 30 is fixed to the second end surface 20f of the piezoelectric element 20. The wiring portion 30 has the first conductive portion 32a and the second conductive portion 32b, both of which are a pair of conductive portions corresponding to a pair of the external electrodes 24a and 24b.

Figure 3:
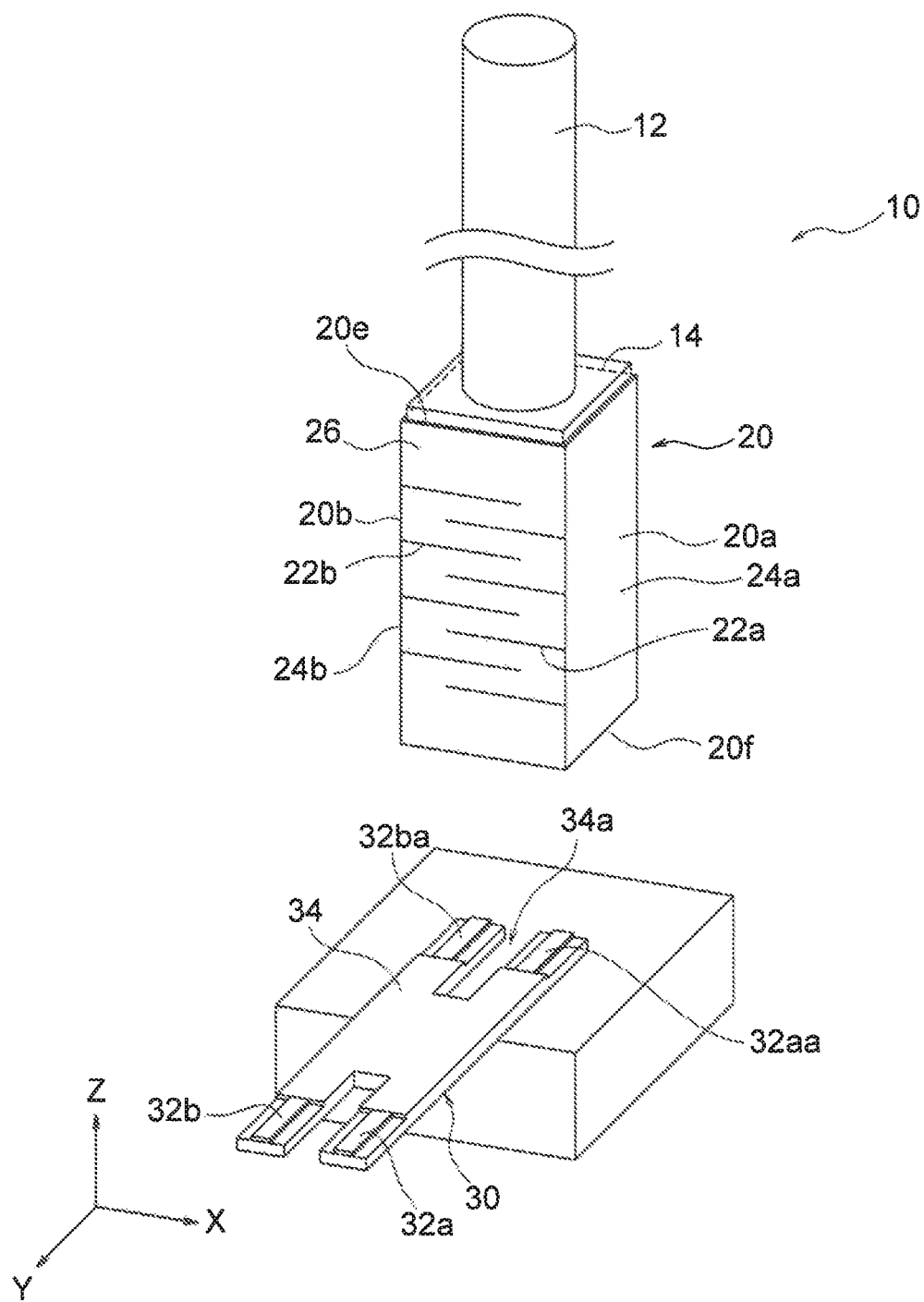
FIG. 3 is an exploded view of the piezoelectric actuator shown in FIG. 1.

As shown in FIG. 3, which is an exploded view and shows no resin portion 50, the wiring portion 30 is a flexible printed circuit board having the first conductive portion 32a electrically connected to the first external electrode 24a, the second conductive portion 32b electrically connected to the second external electrode 24b, and a coating portion 34 with insulation that coats the first conductive portion 32a and the second conductive portion 32b. The first conductive portion 32a and the second conductive portion 32b extend in approximately parallel to each other while their surfaces are coated with the coating portion 34. The wiring portion 30 has a first conductor exposed portion 32aa where the first conductive portion 32a is exposed from the coating portion 34 and a second conductor exposed portion 32ba where the second conductive portion 32b is exposed from the coating portion 34.

Figure 4:
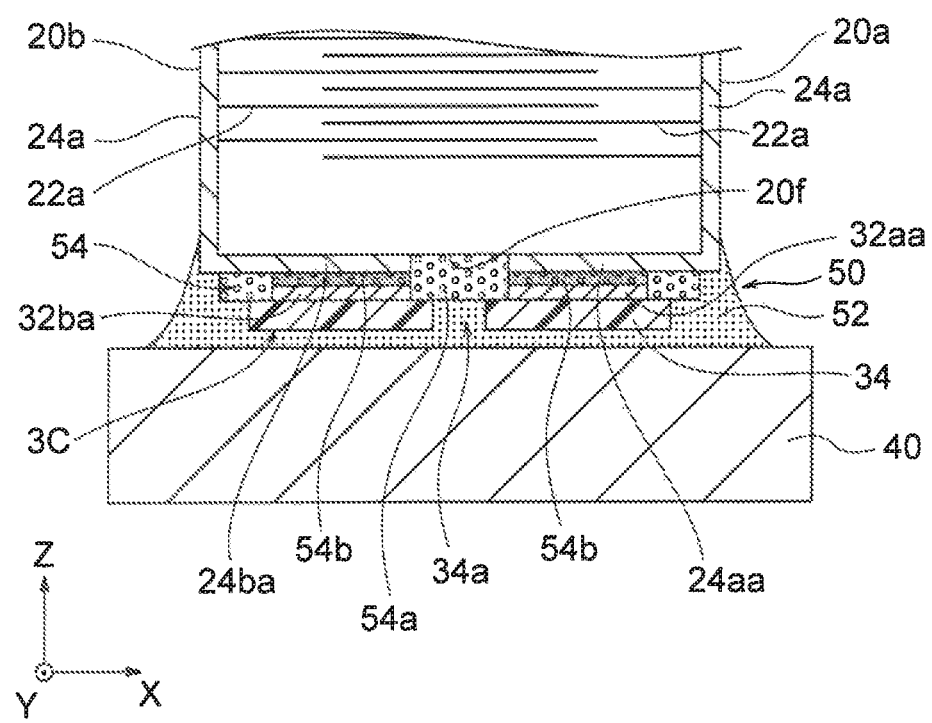
FIG. 4 is a partial cross sectional view of the piezoelectric actuator shown in FIG. 1.

As shown in FIG. 4, which is a cross sectional view, the first conductor exposed portion 32aa is arranged to oppose to the first external electrode end surface portion 24aa, and the second conductor exposed portion 32ba is arranged to oppose to the second external electrode end surface portion 24ba. The coating portion 34 has a through section 34a where the resin portion 50 passes through in the lamination direction between the first conductor exposed portion 32aa and the second conductor exposed portion 32ba.

The first conductive portion 32a and the second conductive portion 32b of the wiring portion 30 are made of any material, such as a noble metal of Ag, Pd, Au, Pt etc., an alloy of these (Ag—Pd etc.), a base metal of Cu, Ni etc., and an alloy of these. The coating portion 34 of the wiring portion 30 is made of any material, such as polyimide.

As shown in FIG. 4, the resin portion 50 fixes the piezoelectric element 20, the weight 40, and the wiring portion 30 each other. The resin portion 50 fixes the piezoelectric element 20, the weight 40, and the wiring portion 30 so that the second end surface 20f opposes to the weight 40 with the wiring portion 30 therebetween, and that the first conductive portion 32a and the second conductive portion 32b are electrically connected to the first external electrode 24a and the second external electrode 24b respectively.

The resin portion 50 has a first resin portion 52 and a second resin portion 54. The first resin portion 52 is arranged to surround space between the wiring portion 30 and the weight 40 and a vicinity of the second resin portion 54. The second resin portion 54 is formed between the second end surface 22f and the wiring portion 30. The second resin portion 54 is composed of an anisotropic conductive film where fine metal particles are mixed in a thermosetting resin, and has a second resin insulation portion 54a with insulation and second resin conductive portions 54b with conductivity.

The second resin conductive portions 54b are formed in a region sandwiched by the first and second external electrode end surface portions 24aa and 24ba of the second end surface 22f and the first and second conductor exposed portions 32aa and 32ba of the wiring portion 30. Thus, the first external electrode end surface portion 24aa and the first conductor exposed portion 32aa and the second external electrode end surface portion 24ba and the second conductor exposed portion 32ba are electrically and physically connected to each other respectively via the second resin conductive portions 54b. The second resin insulation portion 54a is arranged at least between the two second resin conductive portions 54b to insulate them from each other.

The first resin portion 52 is composed of thermosetting resin or so and has insulation. The first resin portion 52, however, may contain a filler, such as metal particles, provided that the insulation between the first external electrode 24a and the second external electrode 24b is ensured in such a manner that the piezoelectric element 20 is not prevented from being driven. The first resin portion 52 is in contact with not only the weight 40 and the wiring portion 30 but the second resin portions 54, the first external electrode 24a, and the second external electrode 24b. Thus, the first resin portion 52 joins not only the wiring portion 30 and the weight 40 but the piezoelectric element 20 and the weight 40, and further joins the piezoelectric element 20 and the wiring portion 30 along with the second resin portions 54.

The piezoelectric actuator 10 is driven by supplying electricity from a driving circuit not shown to the first external electrode 24a and the second external electrode 24b via the wiring portion 30 and applying voltage that causes electrostrictive to the piezoelectric layers 26.

The piezoelectric actuator 10 shown in FIG. 1 to FIG. 4 is manufactured by the following method, for example.

First, the piezoelectric element 20 is prepared in the manufacturing method of the piezoelectric actuator 10. For the piezoelectric element 20, a green sheet where an internal electrode paste film with a predetermined pattern to be the internal electrode layers 22a and 22b after being fired is formed and a green sheet having no internal electrode paste film are prepared.

The green sheets are prepared by the following method, for example. First, a raw material of a material constituting the piezoelectric layers 26 is uniformly mixed by a means of wet mixing or so and dried. Next, this is calcined under firing conditions appropriately selected, and a calcined powder is subjected to wet pulverization. Then, a pulverized calcined powder is turned into a slurry by adding a binder thereto. Next, this slurry is turned into a sheet by a means of a doctor blade method, a screen printing method, or the like and dried to obtain the green sheet having no internal electrode paste film. Furthermore, an internal electrode paste containing the above-mentioned conductive material is applied onto the green sheet by a means of a printing method or so to obtain the green sheet where the internal electrode past film with a predetermined pattern is formed. Incidentally, an inevitable impurity may be contained in the raw material of the material constituting the piezoelectric layers 26.

After preparing the respective green sheets, these prepared green sheets are overlapped, bonded by pressure, subjected to necessary steps such as drying step, and cut to obtain an aggregation of the element body of green.

Next, a sintered body is obtained by firing the obtained lamination body under predetermined conditions and is then cut using a dicing saw or so. Furthermore, the first external electrode 24*a* and the second external electrode 24*b* are formed on portions of the sintered body corresponding to the first side surface 20*a*, the second side surface 20*b*, and the second end surface 20*f*, and a polarization processing of the piezoelectric layers 26 is carried out by applying DC voltage to the electrodes, whereby the piezoelectric element 20 is obtained (see FIG. 1). Incidentally, corners and ridges of the piezoelectric element 20 are preferably subjected to R-plane processing by conducting barrel polishing thereto.

Next, the wiring portion 30 and the weight 40 are fixed onto the second end surface 20*f* of the piezoelectric element 20 via the resin portion 50. In this step, first, the piezoelectric element 20 is placed so that the second end surface 20*f* faces upward, an anisotropic conductive film to be the second resin portion 54 after being cured is formed on the second end surface 20*f*, and the wiring portion 30 is placed on the second end surface 20*f* where the anisotropic conductive film has been formed. Furthermore, an adhesive dry film or so to be the second resin layer after being cured is placed on the wiring portion 30 or on an opposing surface to the wiring portion 30 of the weight 40 and is heated to cure a thermosetting adhesive while the weight 40 is pressed to the second end surface 20*f* under a state where the wiring portion 30 is sandwiched therebetween.

Then, as shown in FIG. 4, the resin portion 50 fixing the piezoelectric element 20, the weight 40, and the wiring portion 30 is formed, and the second resin conductive portions 54*b* respectively electrically connecting the first external electrode end surface portion 24*aa* and the second external electrode end surface portion 24*ba* to the first conductor exposed portion 32*aa* and the second conductor exposed portion 32*ba* are formed at the same time. As shown in FIG. 4, the through section 34*a* is now formed in the coating portion 34, which thus reduces pressure on the anisotropic conductive film positioned between the first conductor exposed portion 32*aa* and the second conductor exposed portion 32*ba*. Thus, the through section 34*a* formed in the coating portion 34 contributes to insulation security between the first conductor exposed portion 32*aa* and the second conductor exposed portion 32*ba* and between the first external electrode end surface portion 24*aa* and the second external electrode end surface portion 24*ba*. The area where the wiring portion 50 is present between the second end surface 20*f* and the weight 40 can be reduced, and thus a bonding force between the piezoelectric element 20 and the weight 40 by the resin portion 50 can be enhanced.

Finally, the position of the piezoelectric element 20 is changed so that the first end surface 20*e* faces upward, the adhesive to be the connection portion 14 after being cured is applied to the second end surface 20*f*, the shaft 12 is joined therewith, the adhesive is cured, whereby the piezoelectric actuator as shown in FIG. 1 is obtained.

Since the wiring portion 30 is fixed to the second end surface 20*f* of an end surface in the lamination direction, the piezoelectric actuator 10 can reduce a problem where the resin portion 50 fixing the wiring portion 30 disturbs a displacement of the piezoelectric element 20. In addition, the piezoelectric actuator 10 is manufactured more easily than conventional piezoelectric actuators because it is structured in such a manner that the second end surface 20*f* opposes to the weight 40 with the wiring portion 30 present therewith, and that the wiring portion 30 fixed to the piezoelectric element 20 and the weight 40 are overlapped on the side of the second end surface 20*f* of the piezoelectric element 20.

As shown in FIG. 2B, the external electrode end surface portions 24*aa* and 24*ba* are formed along a pair of the opposing sides 20*fa* and 20*fb* of the second end surface 20*f*. The external electrodes 24*a* and 24*b* having such external electrode end surface portions 24*aa* and 24*ba* can favorably maintain insulation from each other on the second end surface 20*f*, and can be easily continued from the side surfaces 20*a* and 20*b* of the piezoelectric element 20 to the second end surface 20*f*.

Second Embodiment

Figure 5:
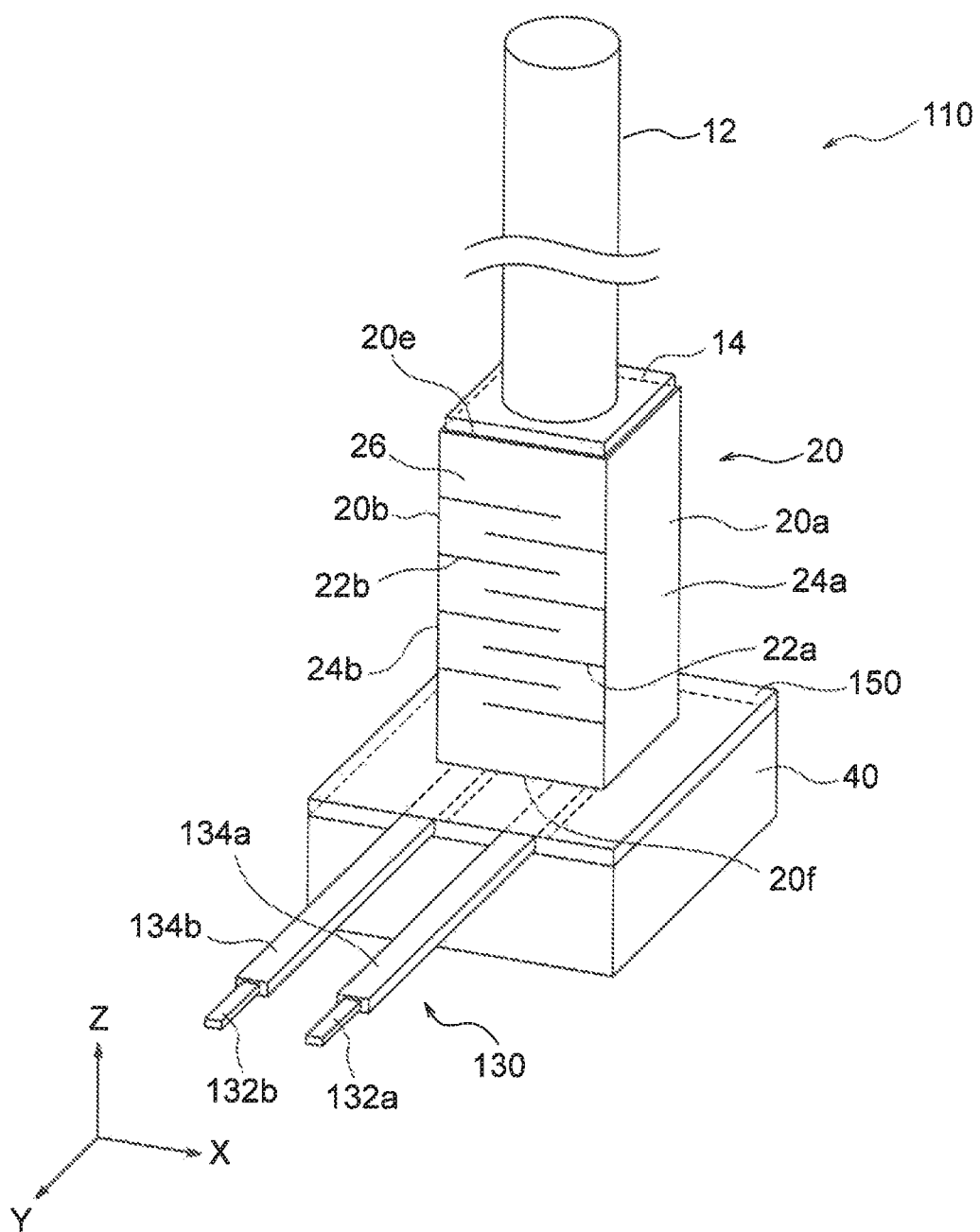
FIG. 5 is a conceptual view showing a piezoelectric actuator according to Second Embodiment of the present invention.

FIG. 5 is a conceptual figure showing a piezoelectric actuator 110 according to Second Embodiment of the present invention. The piezoelectric actuator 110 is identical to the piezoelectric actuator 10 other than a wiring portion 130 and a resin layer 150. Thus, the piezoelectric actuator 110 will be described only in terms of differences between the piezoelectric actuator 10 and the piezoelectric actuator 110.

The wiring portion 130 of the piezoelectric actuator 110 consists of two separate lead wires. That is, the wiring portion 130 has a lead wire consisting of a conductive portion 132*a* and a coating portion 134*a* with insulation coating this and a lead wire consisting of a conductive portion 132*b* and a coating portion 134*b* with insulation coating this. Incidentally, the conductive portions 132*a* and 132*b* are made of the same material as the first and second conductive portions 32*a* and 32*b* described in First Embodiment, and the coating portion 134*a* is also made of any material.

Figure 7:
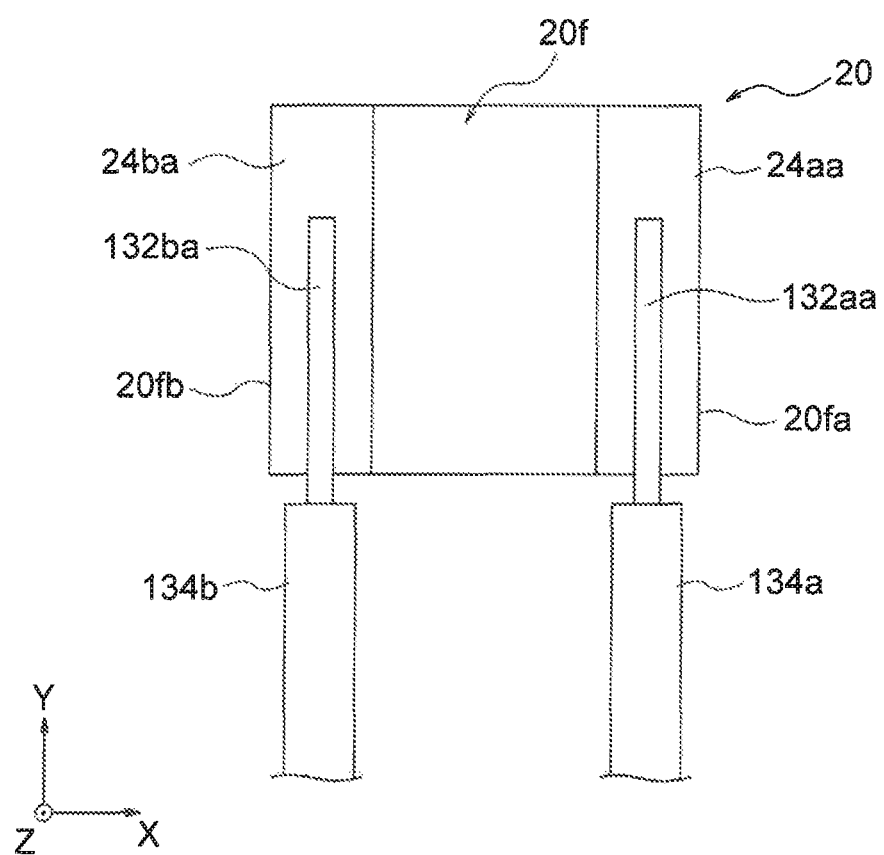
FIG. 7 is a figure showing an arrangement of an element end surface and a wiring portion of the piezoelectric actuator shown in FIG. 5.

FIG. 7 is a figure showing an arrangement of the second end surface 20*f* and the wiring portion 130 with respect to the second end surface 20*f* of the piezoelectric actuator 110. Each lead wire constituting the wiring portion 130 has conductor exposed portions 132*aa* and 132*ba* where the conductive portions 132*a* and 132*b* are exposed from the coating portions 134*a* and 134*b*, and the conductor exposed portions 132*aa* and 132*ba* are connected to the first and second external electrode end surface portions 24*aa* and 24*ba* formed on the second end surface 20*f*.

Figure 6:
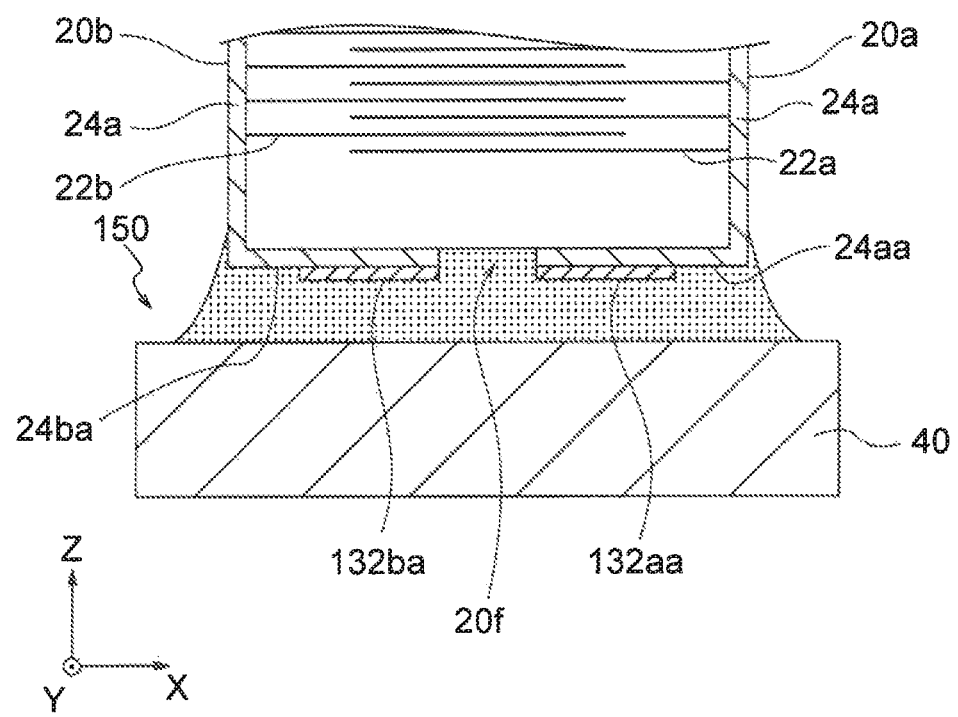
FIG. 6 is a partial cross sectional view of the piezoelectric actuator shown in FIG. 5.

As shown in FIG. 6, which is a cross sectional view, the resin portion 150 fixes the piezoelectric element 20 and the weight 40, and fixes the conductor exposed portions 132*aa* and 132*ba* to the first and second external electrode end surface portions 24*aa* and 24*ba*. The resin portion 150 is made of the same material as the resin portion 52 described in First Embodiment. The piezoelectric actuator 110 shown in FIG. 5 to FIG. 7 demonstrates the same effects as the piezoelectric actuator shown in FIG. 1.

Other Embodiments

The embodiments of the present invention have been described, but the present invention is not limited to such embodiments, and needless to say, can be carried out under various embodiments within the scope not deviating from the purpose of the present invention.

For example, the shape of the element body is not limited to a rectangular parallelepiped shape and may be a polygonal pillar shape or other shape. The first and second external electrodes are formed on any place as long as they are electrically connected to the corresponding first and second internal electrodes, and may be formed on adjacent surfaces of the respective surfaces of the element body. Furthermore, a plurality of external electrodes having the same polarity may be formed on the same surface, or a plurality of external electrodes having different polarity may be formed. The external electrodes and the internal electrodes may be connected directly as the above-mentioned embodiments, but the internal electrodes may be connected to the external electrodes on the surfaces of the piezoelectric element via a through hole or so formed inside the piezoelectric element, for example.

In the piezoelectric actuators 10 and 110 according to First and Second Embodiments, the wiring portions 30 and 130 are arranged between the second end surface 20f and the weight 40, but the wiring portion for supplying electricity to the piezoelectric element may be arranged between the first end surface 20e and the shaft 12. In this case, part of the external electrodes is formed on the first end surface 20e, and thus the first end surface 20e plays a role of an element end surface. Furthermore, the resin portion (corresponding to the connection portion 14) joining the shaft 12 and the first end surface 20e fixes the piezoelectric element 20, the wiring portion, and the shaft 12 so that the first end surface 20e opposes to the shaft 12 with the wiring portion present therewith and that the wiring portion is electrically connected to the external electrodes 24a and 24b.

Figure 8A:
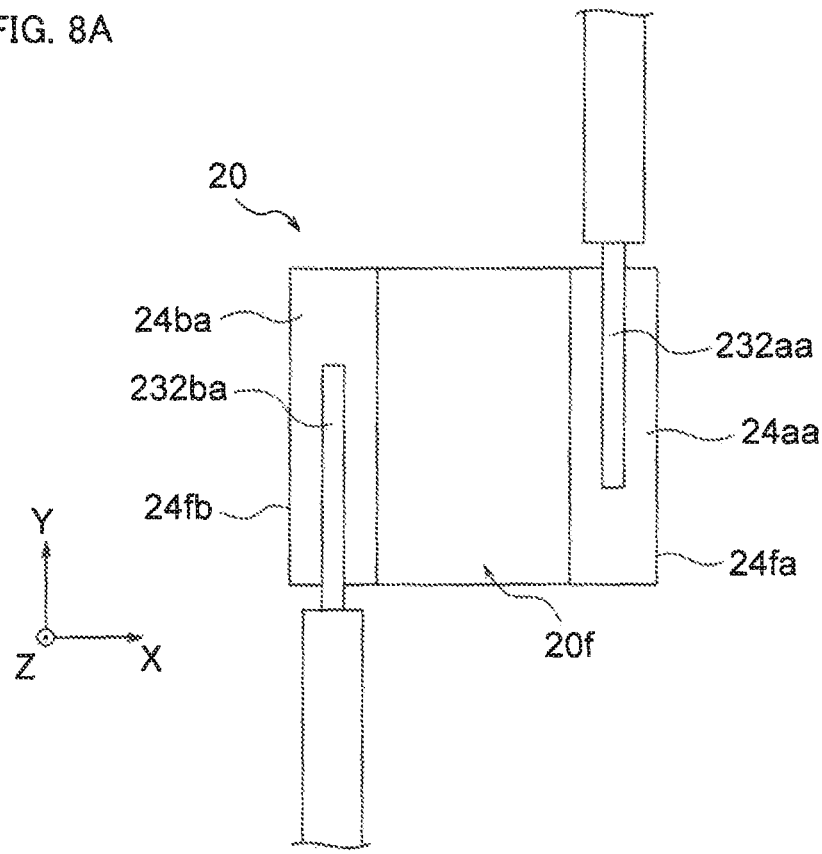
FIG. 8A and FIG. 8B are a figure showing an arrangement of an element end surface and a wiring portion of a piezoelectric actuator according to first and second variations.

FIG. 8A is a figure showing a variation (first variation) of positional relation between the second end surface 20f and conductor exposed portions 232aa and 232ba of lead wires, and shows a variation of the piezoelectric actuator 110 shown in FIG. 7. In the variation shown in FIG. 8A, the two lead wires are fixed to the second end surface 20f so that each tip thereof is directed to face each other. Even in such an arrangement, the same effects as the embodiments are demonstrated.

Figure 8B:
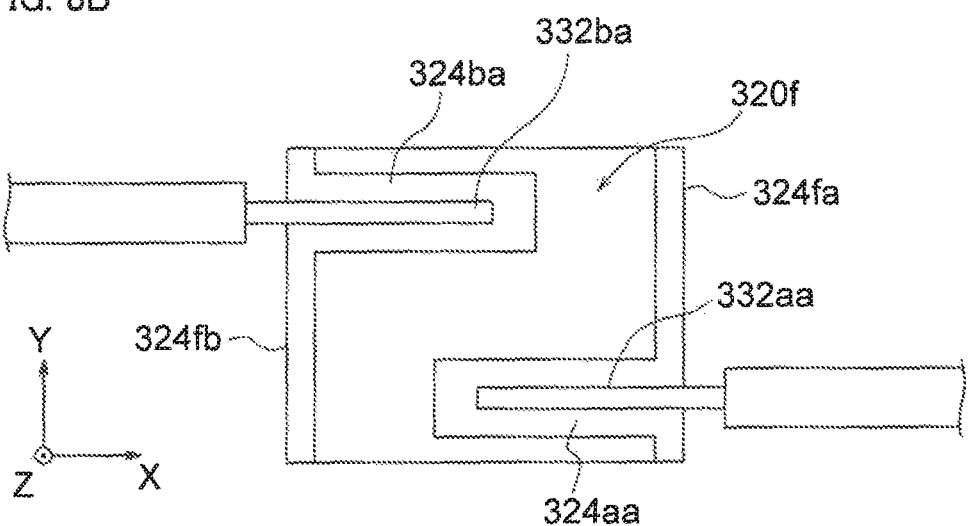

FIG. 8B is a figure showing a variation (second variation) of positional relation between a second end surface 320f and conductor exposed portions 332aa and 332ba of lead wires, and shows a variation of the piezoelectric actuator 110 shown in FIG. 7. In the variation shown in FIG. 8B, a first external electrode end surface portion 324aa on the second end surface 320f extends from an opposing side 324fa, which is one of a pair of opposing sides 324fa and 324fb of the second end surface 320f, to an opposing side 324fb, which is the other opposing side, and a second external electrode end surface portion 324ba extends from the opposing side 324fb, which is the other opposing side of the pair of the opposing sides 324fa and 324fb, to the opposing side 324fa, which is one opposing side.

In the variation shown in FIG. 8B, the two lead wires having the conductor exposed portions 332aa and 332ba are fixed to the second end surface 320f so that each tip thereof is directed to face each other. As is the case with the variation shown in FIG. 8A, the external electrodes having the external electrode end surface portions 324aa and 324ba as shown in FIG. 8B can also favorably maintain mutual insulation on the second end surface 320f, and can be easily continuous from the side surfaces of the piezoelectric element to the second end surface 320f.

Figure 9:
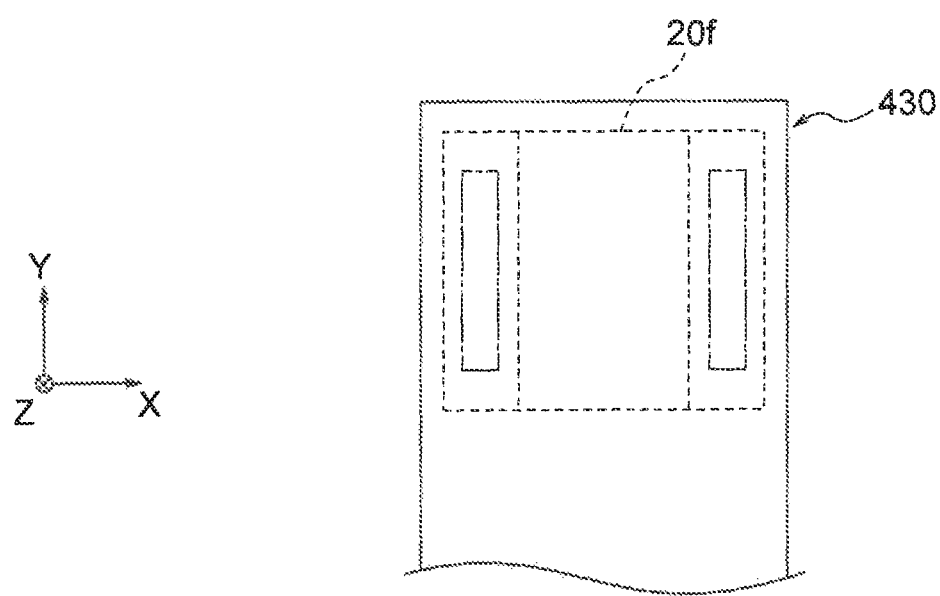
FIG. 9 is a figure showing an arrangement of an element end surface and a wiring portion of a piezoelectric actuator according to a third variation.

FIG. 9 is a figure showing a variation (third variation) of positional relation between the second end surface 20f and a wiring portion 430 composed of a flexible printed circuit board, and shows a variation of the piezoelectric actuator 10 shown in FIG. 3. The wiring portion 430 shown in FIG. 9 is relatively wider than the second end surface 20f and has no structure corresponding to the through section 34a as shown in FIG. 3, and thus the entire second end surface 20f opposes to the wiring portion 430.

The variation shown in FIG. 9 has a large opposing area between the second end surface 20f and the wiring portion 430 and thus can enhance a joining force between the second end surface 20f and the wiring portion 430.

Figure 10:
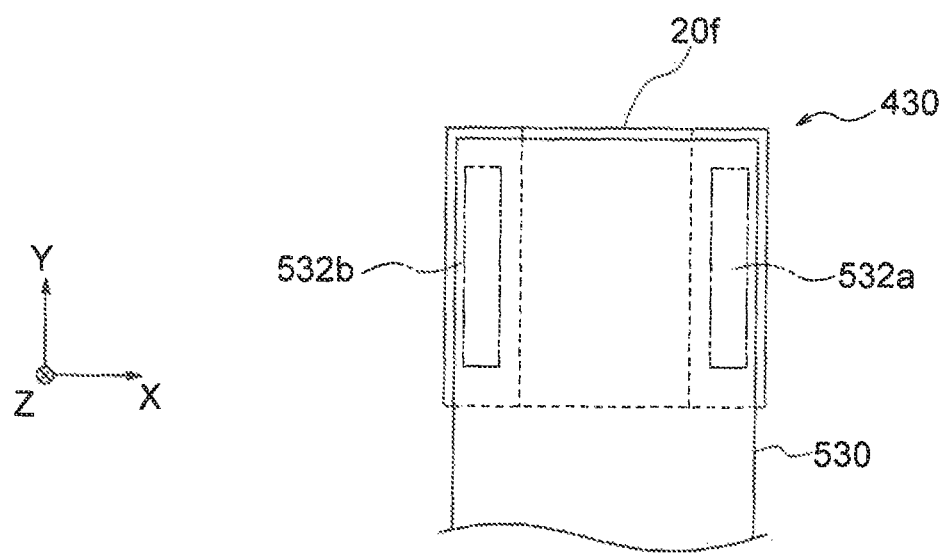
FIG. 10 is a figure showing an arrangement of an element end surface and a wiring portion of a piezoelectric actuator according to a fourth variation.

FIG. 10 is a figure showing a variation (fourth variation) of positional relation between the second end surface 20f and a wiring portion 530 composed of a flexible printed circuit board, and shows a variation of the piezoelectric actuator 10 shown in FIG. 3. In the wiring portion 430 shown in FIG. 10, a length in the width direction (X-axis direction) vertical to the lamination direction (Z-axis direction) and to the extending direction (Y-axis direction) of conductive portions 532a and 532b is shorter than that of the second end surface 20f. This makes it easy to allow the resin portion to go around outside the wiring portion 430 and connect the second end surface 20f and the weight 40. Thus, such a piezoelectric actuator according to the fourth variation can improve a fixing reliability due to the resin portion.

NUMERICAL REFERENCES 10, 110 . . . piezoelectric actuator
12 . . . shaft
14 . . . connection portion
20 . . . piezoelectric element
20a . . . first side surface
20b . . . second side surface
20e . . . first end surface
20f, 320f . . . second end surface
20fa, 324fa . . . one opposing side
20fb, 324fb . . . the other opposing side
22a, 22b . . . internal electrode layer
24a . . . first external electrode
24b . . . second external electrode
24aa . . . first external electrode end surface portion
24ba . . . second external electrode end surface portion
26 . . . piezoelectric layer
30, 430, 530 . . . wiring portion
32a, 132a, 532a . . . first conductive portion
32aa, 132aa, 232aa, 332aa . . . first conductor exposed portion
32b, 132b, 532b . . . second conductive portion
32ba, 132ba, 232ba, 332ba . . . second conductor exposed portion
34, 134a, 134b . . . coating portion
34a . . . through section
40 . . . weight
50 . . . resin portion
52 . . . first resin portion
54 . . . second resin portion
54a . . . second resin insulation portion
54b . . . second resin conductive portion

The invention claimed is:
1. A piezoelectric actuator comprising:
a piezoelectric element forming a pair of external electrodes on surfaces of the piezoelectric element; alternately laminating internal electrode layers electrically connected to the external electrodes with piezoelectric layers therebetween; and providing part of the external electrodes on an element end surface constituting part of the surfaces and an end surface in a lamination direction of the piezoelectric element, a connection member consisting of one of a shaft and a weight connected to a side of the element end surface of the piezoelectric element, the other one of the shaft and the weight connected to a side of a first end surface constituting an end surface opposing to the element end surface of the piezoelectric element, a wiring portion having a pair of conductive portions corresponding to the pair of the external electrodes, and a resin portion fixing the piezoelectric element, the connection member, and the wiring portion so that the element end surface opposes to the connection member with the wiring portion therebetween and that the conductive portions are electrically connected to the external electrodes.

2. The piezoelectric actuator according to claim 1, wherein
the external electrodes on the element end surface are formed along a pair of opposing sides of the element end surface.

3. The piezoelectric actuator according to claim 1, wherein
one of the external electrodes on the element end surface extends from one of a pair of opposing sides of the element end surface to the other side of the pair of the opposing sides, and the other external electrode on the element end surface extends from the other side of the pair of the opposing sides to the one side of the pair of the opposing sides.

4. The piezoelectric actuator according to claim 1, wherein
the wiring portion is a flexible printed circuit board having a coating portion with insulation configured to coat the pair of the conductive portions, and
a through section where the resin portion passes through between the pair of the conductive portions in the lamination direction is formed in the coating portion.

5. The piezoelectric actuator according to claim 2, wherein
the wiring portion is a flexible printed circuit board having a coating portion with insulation configured to coat the pair of the conductive portions, and
a through section where the resin portion passes through between the pair of the conductive portions in the lamination direction is formed in the coating portion.

6. The piezoelectric actuator according to claim 3, wherein
the wiring portion is a flexible printed circuit board having a coating portion with insulation configured to coat the pair of the conductive portions, and
a through section where the resin portion passes through between the pair of the conductive portions in the lamination direction is formed in the coating portion.

7. The piezoelectric actuator according to claim 1, wherein
the wiring portion is a flexible printed circuit board having a coating portion with insulation configured to coat the pair of the conductive portions, and
an entire surface of the element end surface opposes to the wiring portion.

8. The piezoelectric actuator according to claim 2, wherein
the wiring portion is a flexible printed circuit board having a coating portion with insulation configured to coat the pair of the conductive portions, and
an entire surface of the element end surface opposes to the wiring portion.

9. The piezoelectric actuator according to claim 3, wherein
the wiring portion is a flexible printed circuit board having a coating portion with insulation configured to coat the pair of the conductive portions, and
an entire surface of the element end surface opposes to the wiring portion.

10. The piezoelectric actuator according to claim 1, wherein
the wiring portion is a flexible printed circuit board having a coating portion with insulation configured to coat the pair of the conductive portions, and
a length of the wiring portion in a width direction vertical to the lamination direction and to an extending direction of the conductive portions is shorter than a length of the element end surface in the width direction.

11. The piezoelectric actuator according to claim 2, wherein
the wiring portion is a flexible printed circuit board having a coating portion with insulation configured to coat the pair of the conductive portions, and
a length of the wiring portion in a width direction vertical to the lamination direction and to an extending direction of the conductive portions is shorter than a length of the element end surface in the width direction.

12. The piezoelectric actuator according to claim 3, wherein
the wiring portion is a flexible printed circuit board having a coating portion with insulation configured to coat the pair of the conductive portions, and
a length of the wiring portion in a width direction vertical to the lamination direction and to an extending direction of the conductive portions is shorter than a length of the element end surface in the width direction.

* * * * *